(12) United States Patent
Park et al.

(10) Patent No.: US 9,022,618 B2
(45) Date of Patent: May 5, 2015

(54) ASPHERICAL LED LENS AND LIGHT EMITTING DEVICE INCLUDING THE SAME

(71) Applicant: Seoul Semiconductor Co., Ltd., Ansan-si (KR)

(72) Inventors: Kwang Il Park, Ansan-si (KR); Sang Cheol Lee, Ansan-si (KR); Jeong A Han, Ansan-si (KR); Woong Jun Hwang, Ansan-si (KR); Hee Tak Oh, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 8 days.

(21) Appl. No.: 14/081,338

(22) Filed: Nov. 15, 2013

(65) Prior Publication Data
US 2014/0071696 A1 Mar. 13, 2014

Related U.S. Application Data

(63) Continuation of application No. 12/985,464, filed on Jan. 6, 2011, now Pat. No. 8,602,605.

(30) Foreign Application Priority Data

Jan. 7, 2010 (KR) .................. 10-2010-0001059
Mar. 30, 2010 (KR) .................. 10-2010-0028693

(51) Int. Cl.
*F21V 5/04* (2006.01)
*G02B 27/09* (2006.01)
(Continued)

(52) U.S. Cl.
CPC ............ *F21V 5/046* (2013.01); *G02B 27/0955* (2013.01); *H01L 33/58* (2013.01);
(Continued)

(58) Field of Classification Search
CPC . F21V 5/046; G02B 19/0014; G02B 19/0061
USPC ........... 362/311.02, 311.06, 311.09, 332, 336
See application file for complete search history.

(56) References Cited

U.S. PATENT DOCUMENTS

2002/0163808 A1  11/2002  West et al.
2006/0067079 A1  3/2006  Noh et al.
(Continued)

FOREIGN PATENT DOCUMENTS

JP  2003-008068  1/2003
JP  2006-114863  4/2006
(Continued)

OTHER PUBLICATIONS

Preliminary Notice of First Office Action issued in Taiwanese Patent Application No. 100100487, dated Jun. 20, 2013.
(Continued)

*Primary Examiner* — David V Bruce
(74) *Attorney, Agent, or Firm* — H.C. Park & Associates, PLC

(57) ABSTRACT

Exemplary embodiments of the present invention relate to an aspherical light emitting diode (LED) lens and a light emitting device including the same. The aspherical LED lens includes a light exit plane concavely depressed near a central axis, a light entrance plane including a conical plane having a vertex located on the central axis, and a plurality of protrusions arranged on a portion of a side surface of the light exit plane. The aspherical LED lens has a radially symmetrical structure with respect to the central axis.

15 Claims, 13 Drawing Sheets

(51) Int. Cl.
- *H01L 33/58* (2010.01)
- *G02B 19/00* (2006.01)
- *F21W 131/103* (2006.01)
- *F21Y 101/02* (2006.01)

(52) U.S. Cl.
CPC ........ *G02B19/0095* (2013.01); *G02B 19/0014* (2013.01); *G02B 19/0061* (2013.01); *F21V 5/04* (2013.01); *F21W 2131/103* (2013.01); *F21Y 2101/02* (2013.01); *H01L 2924/0002* (2013.01); *H01L 2224/48091* (2013.01)

(56) References Cited

U.S. PATENT DOCUMENTS

| | | |
|---|---|---|
| 2006/0133044 A1 | 6/2006 | Kim et al. |
| 2007/0195534 A1 | 8/2007 | Ha et al. |
| 2009/0052192 A1 | 2/2009 | Kokubo et al. |
| 2010/0073907 A1 | 3/2010 | Wanninger et al. |
| 2010/0165640 A1 | 7/2010 | Lin et al. |

FOREIGN PATENT DOCUMENTS

| | | |
|---|---|---|
| JP | 2006-237199 | 9/2006 |
| JP | 2007-171079 | 7/2007 |
| JP | 2008-084989 | 4/2008 |
| JP | 3148493 | 1/2009 |
| JP | 2009-510731 | 3/2009 |
| JP | 2009-218243 | 9/2009 |
| KR | 10-2007-0021873 | 2/2007 |
| KR | 10-0692432 | 3/2007 |
| KR | 10-0869573 | 11/2008 |
| KR | 10-2009-0024996 | 3/2009 |
| KR | 10-2009-0032867 | 4/2009 |
| KR | 10-2009-0104580 | 10/2009 |
| TW | 200824897 | 6/2008 |
| TW | 200936952 | 9/2009 |
| WO | 2007/036186 | 4/2007 |

OTHER PUBLICATIONS

International Search Report dated Aug. 23, 2011, corresponding to International Application No. PCT/KR2011/000101.
Non-Final Office Action dated Apr. 30, 2013 issued in U.S. Appl. No. 12/985,464.
Notice of Allowance dated Aug. 6, 2013 issued in U.S. Appl. No. 12/985,464.

(a)

(b)

(c)

ASPHERICAL LED LENS AND LIGHT EMITTING DEVICE INCLUDING THE SAME

CROSS-REFERENCE TO RELATED APPLICATIONS

This application is a continuation of U.S. patent application Ser. No. 12/985,464, filed on Jan. 6, 2011, and claims priority from and the benefit of Korean Patent Application No. 10-2010-0001059, filed on Jan. 7, 2010, and Korean Patent Application No. 10-2010-0028693, filed on Mar. 30, 2010, which are hereby incorporated by reference for all purposes as if fully set forth herein.

BACKGROUND OF THE INVENTION

1. Field of the Invention

Exemplary embodiments of the present invention relate to a lens for light emitting diodes (LEDs) and, more particularly, to an aspherical LED lens and a light emitting device including the same.

2. Discussion of the Background

A LED refers to a semiconductor device that has a p-n junction and emits light upon recombination of electrons and holes in the p-n junction based on a potential difference formed therein. An LED may be composed of compound semiconductors such as GaN, GaAs, GaP, $GaAs_{1-x}P_x$, $Ga_{1-x}Al_xAs$, InP, $In_{1-x}Ga_xP$, etc., and has generally been used for display lamps or devices for displaying simple information such as numerals. In recent years, with the development of technologies such as information display technology and semiconductor technology, LEDs may be used not only for flat panel displays such as liquid crystal display devices, but also for general lighting.

LEDs may have advantages, such as superior energy efficiency to and longer lifespan than existing light sources, no discharge of harmful ultraviolet (UV) light, and environmental friendliness, and are thus increasingly a focus of attention as a light source that can replace existing cold cathode fluorescent lamps (CCFL).

However, when LEDs are applied to a light source for a backlight unit of a display device, a panel disposed directly on the LEDs may have high illumination but a region between the LEDs may have low illumination due to point light source characteristics of the LEDs, whereby the entirety of the panel may have uneven illumination. Further, when the LEDs are applied to a street lamp, for example, only a region directly below the street lamp may be bright, and a road surface between street lamps may be dark, causing pedestrian or driver inconvenience.

Specifically, a conventional LED will be described herein with reference to an example wherein a semispherical LED lens is employed as a light source for a backlight unit.

FIG. 1 is a side sectional view of a light emitting device 100 including a is conventional semispherical LED lens, FIG. 2 is a graph depicting an orientation angle curve of light emitted from the light emitting device 100, and FIG. 3 is a graph depicting illumination on a panel of a display device according to arrangement of the light emitting devices 100 when the light emitting devices 100 are used as a light source for the backlight unit.

As shown in FIG. 1, the conventional light emitting device 100 includes an LED chip 2 and a semispherical LED lens 4 which adjust an angle of light emitted from the LED chip 2. Although not shown in the drawings, the light emitting device 100 may further include a fluorescent material deposited on the LED chip 2 to generate white light.

Referring to FIG. 2, since light emitted from the light emitting device 100 as shown in FIG. 1 is focused on the center of the lens 4 due to the semispherical structure of the lens 4, the light may have a symmetrical pattern of orientation angles such that illumination increases towards a central axis of the lens and gradually decreases towards right and left sides thereof.

Accordingly, as shown in FIG. 3, when the light emitting devices 100 including the semispherical LED lenses are linearly arranged in the backlight unit of the display device, illumination on a panel above the light emitting devices 100 may be uneven, and bright and dark areas may be repeatedly formed on the panel.

SUMMARY OF THE INVENTION

Exemplary embodiments of the present invention provide an aspherical LED lens and a light emitting device including the same, which may provide a double peak type pattern of orientation angles of light emitted from an LED chip while minimizing chromatic aberration.

Exemplary embodiments of the present invention also provide an aspherical LED lens and a light emitting device including the same, which may make orientation angle curves of light emitted from a light emitting diode chip asymmetrical with respect to a major axis and a minor axis of the LED lens.

Additional features of the invention will be set forth in the description which follows and in part will be apparent from the description, or may be learned by practice of the invention.

An exemplary embodiment of the present invention discloses an aspherical light emitting diode (LED) lens. The aspherical LED lens includes a light exit plane concavely depressed near a central axis, a light entrance plane including a conical plane having a vertex located on the central axis, and a plurality of protrusions arranged on a portion of a side surface of the light exit plane, wherein the aspherical LED lens has a radially symmetrical structure with respect to a central axis thereof.

An exemplary embodiment of the present invention also discloses a light emitting device. The light emitting device includes a housing; a light emitting diode (LED) chip arranged on the housing; and an aspherical LED lens arranged on the LED chip, the aspherical LED lens having a radially symmetrical structure with respect to a central axis of the LED lens. The aspherical LED lens includes a light exit plane concavely depressed near the central axis; a light entrance plane including a conical plane having a vertex located on the central axis, and a plurality of protrusions arranged on a portion of a side surface of the light exit plane.

An exemplary embodiment of the present invention also discloses a light emitting device. The light emitting device includes a substrate, an LED chip arranged on the substrate and an aspherical LED lens arranged on the LED chip. The aspherical LED lens has different cross-sections respectively taken along a major axis and a minor axis of the LED lens.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
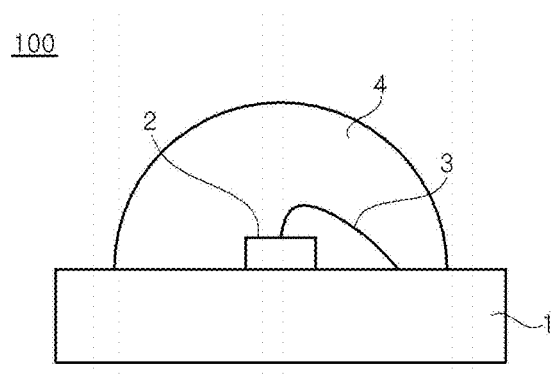
FIG. 1 is a side sectional view of a light emitting device including a conventional semispherical LED lens.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 4:
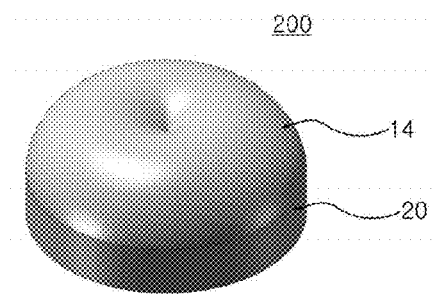
FIG. 4 is a perspective view of a light emitting device including an aspherical LED lens.
Figure 5:
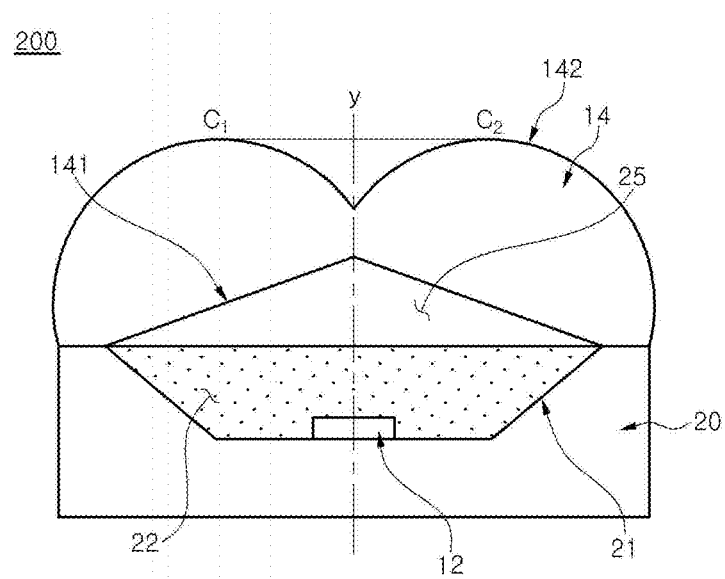
FIG. 5 is a side sectional view of the light emitting device including the aspherical LED lens.
Figure 6:
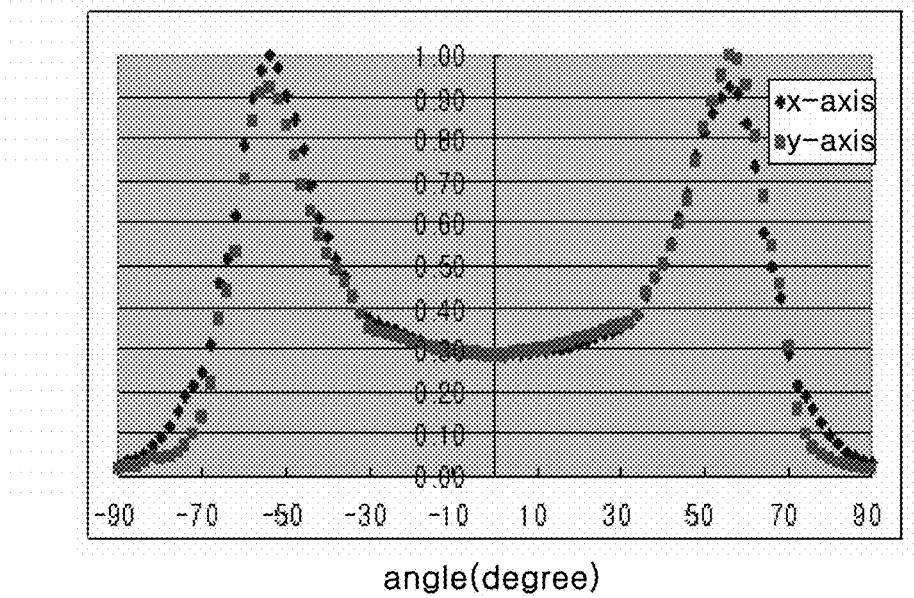
FIG. 6 is a graph depicting an orientation angle curve of light emitted from the aspherical LED lens.
Figure 7:
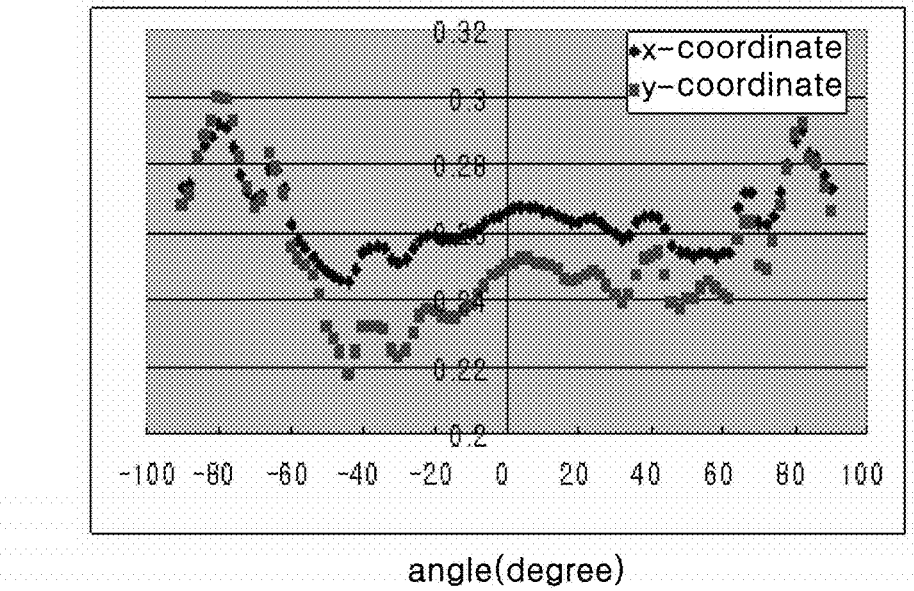
FIG. 7 is a graph depicting chromatic aberration of the aspherical LED lens.

FIGS. 4 and 5 are a perspective view and a side sectional view of a light emitting device including an aspherical LED lens, and FIGS. 6 and 7 are graphs depicting an orientation angle curve of light emitted from the aspherical LED lens of FIG. 4 and a graph depicting chromatic aberration of the aspherical LED lens of FIG. 4.

Referring to FIGS. 4 and 5, a light emitting device 200 includes a housing 20 having a cavity 21 formed therein, an LED chip 12 mounted on the housing 20, an encapsulation material 22 in the cavity 21, and an aspherical LED lens 14.

The aspherical LED lens 14 may be formed of a light-transmitting material such as silicone, epoxy, glass or plastic and have phosphors dispersed therein. Further, the aspherical LED lens 14 may include a light entrance plane 141 and a light exit plane 142, and has a radially symmetrical structure with respect to a central axis (y) of the LED lens 14.

Here, the light entrance plane 141 refers to a plane, upon which light emitted from the LED chip 12 and passing through the encapsulation material 142 is incident, and is composed of a conical plane having a vertex located on the central axis. An air layer 25 may be present in a space between the light entrance plane 141 and the encapsulation material 22. Further, the light exit plane 142 refers to a plane, through which light passing through the LED lens 14 is emitted to the outside of the LED lens, and has an overlapped region of two convex semispherical shapes partially overlapping each other around the central axis. The overlapped region around the central axis may be a concavely depressed region.

Figure 2:
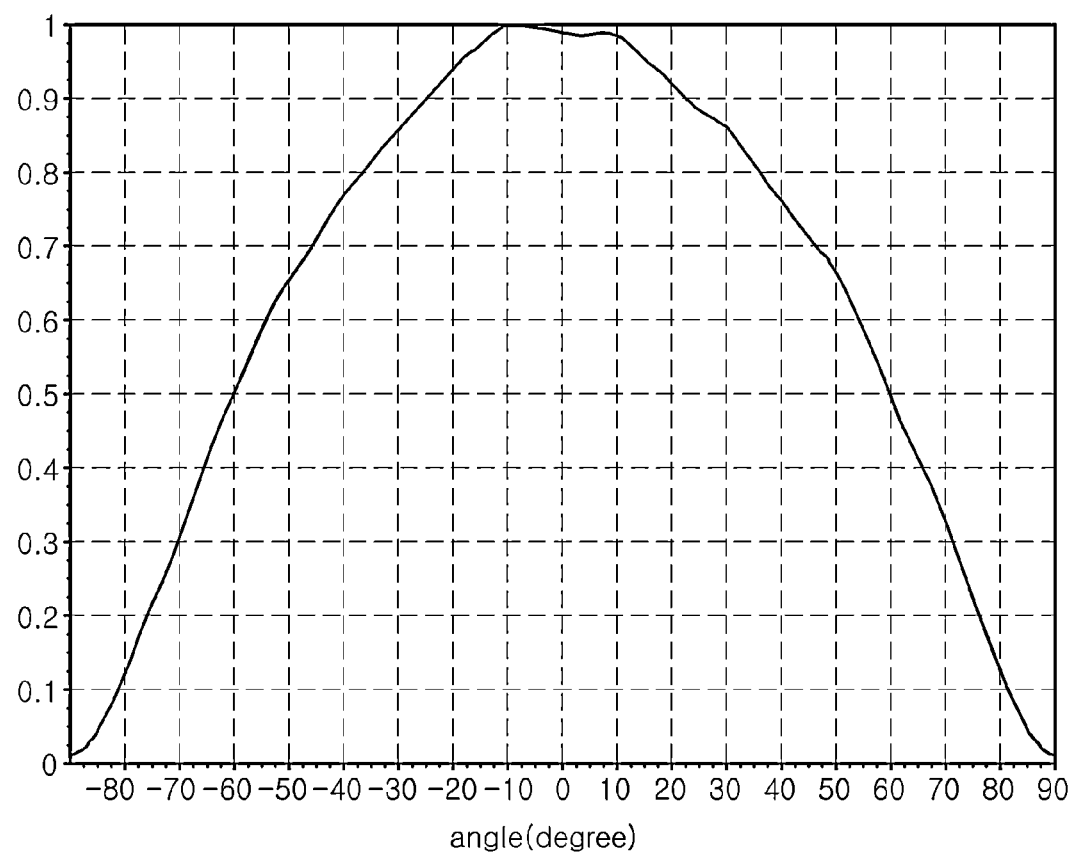
FIG. 2 is a graph depicting an orientation angle curve of light emitted from the light emitting device of FIG. 1.
Figure 3:
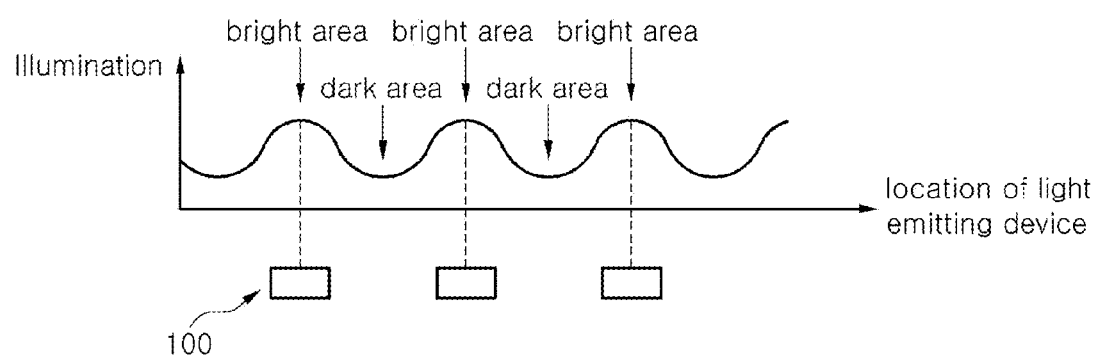
FIG. 3 is a graph depicting illumination on a panel of a display device with an arrangement of the light emitting devices shown in FIG. 1.

With this configuration of the aspherical lens 14, the amount or intensity of light decreases near a center of the aspherical LED lens 14, that is, near the central axis of the aspherical LED lens 14, and increases near a periphery of the aspherical LED lens 14, thereby providing an orientation angle curve as shown in FIG. 6. Specifically, when compared with FIG. 2, the orientation angle curve of FIG. 6 has two peaks at both sides of the lens (near an angle of about +/−67 degrees) instead of the center of the lens (at an angle of zero), and the amount or intensity of light at the center of the graph is about 30~40% of the peak value.

Thus, when such an aspherical lens 14 is employed as a light source for a backlight unit of a display device, the display device may have uniform illumination and brightness on the panel of the display device thereby solving the problem of the conventional LED lens wherein bright areas are formed on regions of a panel directly above LED packages and dark areas are formed on regions of the panel between adjacent LED packages.

The aspherical lens 14, which does not include a dispersing agent, may exhibit more severe chromatic aberration than the conventional semispherical lens 4 due to the shape of the lens, as in a chromatic aberration curve of FIG. 7. Specifically, in the orientation angle curve of the aspherical lens 14 not including a dispersing agent, an X-coordinate variation (ΔX) is about 0.047 and a Y-coordinate variation (ΔY) is about 0.082 at an orientation angle within ±90 degrees. Therefore, it can be seen that the aspherical lens 14 causes severe chromatic aberration. As a result, spots such as yellow spots or yellow rings may be generated on the panel due to chromatic aberration.

On the other hand, when the aspherical lens 14 includes the dispersing agent to solve the problem of chromatic aberration, the dispersing agent may undesirably reduce the amount of light emitted from the lens or may have an undesirable effect on the orientation angle. Therefore, the use of only the dispersing agent may be insufficient to achieve a reduction in the chromatic aberration.

Next, an aspherical lens according to one exemplary embodiment will be described with reference to FIGS. 8 to 10.

Figure 8:
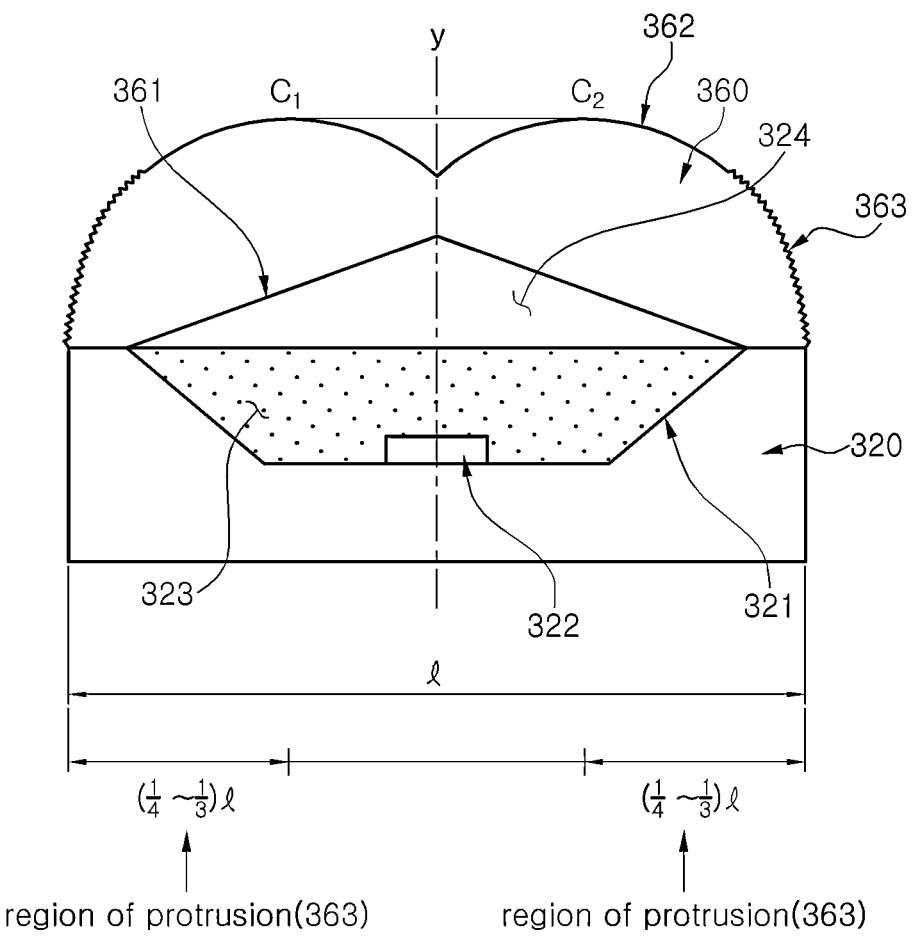
FIG. 8 is a side sectional view of a light emitting device employing an aspherical LED lens including a plurality of side protrusions according to an exemplary embodiment of the present invention.

FIG. 8 is a side sectional view of a light emitting device having an aspherical LED lens including a plurality of side protrusions according to an exemplary embodiment of the present invention. FIGS. 9 and 10 are an orientation angle curve of light emitted from the aspherical LED lens of FIG. 8 and a chromatic aberration graph of the aspherical LED lens, respectively.

Referring to FIG. 8, a light emitting device 1000 includes a housing 320 having a cavity 321 formed therein, an LED chip 322, an encapsulation material 323 and an aspherical LED lens 360.

In the housing 320, the cavity 321 has a predetermined depth and may be configured to surround the LED chip 322. Advantageously, the depth of the cavity 321 may be greater than or equal to the height of the LED chip 322.

The encapsulation material 323 is a light-transmitting material, such as silicone or epoxy, with which the cavity 321 is filled, and encapsulates the LED chip 322 to cover and protect the LED chip 322.

The LED chip 322 is mounted on an upper surface of the housing 320 and emits, for example, blue light in a wavelength band of 430~480 nm or UV light in a wavelength band of 350~410 nm. Alternatively, the LED chip 322 may be configured to emit other colors. As such, the present invention is not limited to a specific LED chip.

The LED chip 322 is mounted on the upper surface of the housing 320 and may be placed at a location where a central axis of the aspherical LED lens 360 meets the housing 320. Specifically, the LED chip 322 may be disposed at the center of the aspherical LED lens 360, which may be bonded or joined to the upper surface of the housing 320 including the LED chip 322 by an adhesive or other means. Although the aspherical LED lens 360 is illustrated as being disposed over a single LED chip in FIG. 8, it should be understood that the aspherical LED lens may be disposed over a plurality of LED chips. That is, the plural LED chips may be disposed at the central axis (or at the center) of the LED lens 360 and around the central axis thereof.

Further, a fluorescent material may be directly deposited on the LED chip 322 or contained in the encapsulation material 323 or a resin constituting the aspherical LED lens 360. Here, the fluorescent material may emit light of a certain color using light emitted from the LED chip 322 as an excitation source. For example, if the LED chip 322 is a blue LED chip is composed of semiconductors for emitting light in a wavelength band of 430~480 nm, phosphors emitting yellow-green or yellow light using some of the light as an excitation source are deposited on the LED chip 322, so that the light emitting device can emit white light by a combination of blue light emitted from the LED chip 322 and yellow-green or yellow light emitted from the phosphors.

Further, the aspherical LED lens 360 includes a light entrance plane 361 and a light exit plane 362, and has a radially symmetrical structure with respect to a central axis (y) of the LED lens 360.

Here, the light entrance plane 361 refers to a plane, upon which light emitted from the LED chip 322 and passing through the encapsulation material 323 is incident, and is composed of a conical plane having a vertex located on the central axis (y). An air layer 324 may be present in a space between the light entrance plane 361 and the encapsulation material 323. Further, the light exit plane 362 refers to a plane, through which light passing through the lens 360 is emitted to the outside of the LED lens 360, and has an overlapped region of two convex semispherical shapes C1, C2 partially overlapping each other around the central axis (y). The overlapped region around the central axis (y) may be a concavely depressed region. Further, the light exit plane 361 includes a plurality of protrusions (roughness) 363 partially formed on a side surface thereof. As shown in FIG. 8, the protrusions 363 may be formed over a region from a point below the highest point of the light exit plane, for example, from a point corresponding to about ¼~⅓ of the overall lens width from either end of the lens, to the end of the lens. The protrusions 363 may be formed on the side surface of the light exit plane by forming protrusions (roughness) of about 0.4~1.0 μm height from the LED lens 360 surface on a mold through sand blasting, followed by injection molding a liquid silicone rubber described below into the mold.

Figure 9:
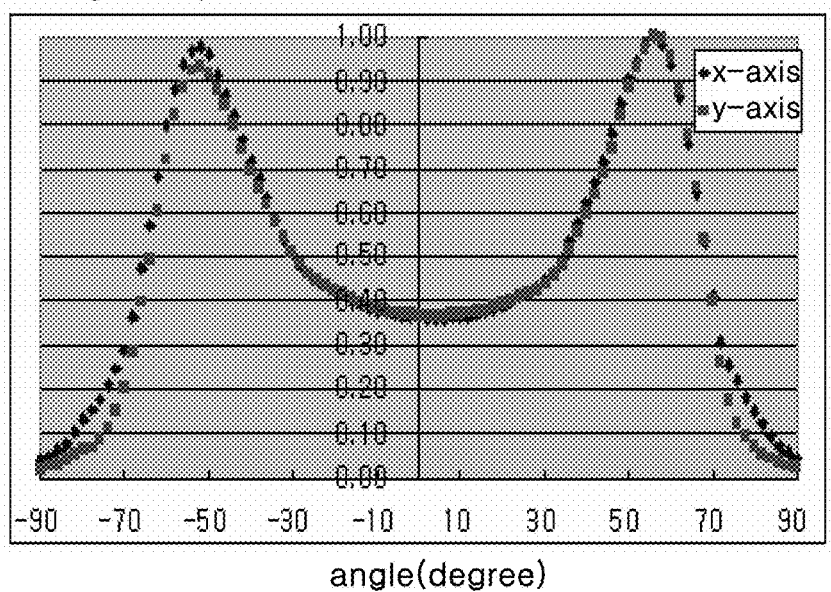
FIG. 9 is a graph depicting an orientation angle curve of light emitted from the aspherical LED lens of FIG. 8.

Different from the conventional semispherical lens 4, the aspherical lens 360 exhibits a decrease in amount or intensity of light near the center of the lens (near the central axis) and exhibits an increase in amount or intensity of light near the periphery of the lens, thereby providing an orientation angle curve of light as shown in FIG. 9.

Specifically, the orientation angle curve of FIG. 9 has two peaks at both sides of the lens (near an angle of about +/−67 degrees) instead of the center of the lens (at an angle of zero), an angle between the two peaks, that is, a peak-to-peak angle, is about 110 degrees, and the amount or intensity of light at the center of the graph is about 30~40%, more accurately, about 36%, of the peak value. Namely, the formation of the side protrusions 363 does not change an original orientation angle curve, unlike the case where the reduction of chromatic aberration is attempted using the dispersing agent.

Figure 10:
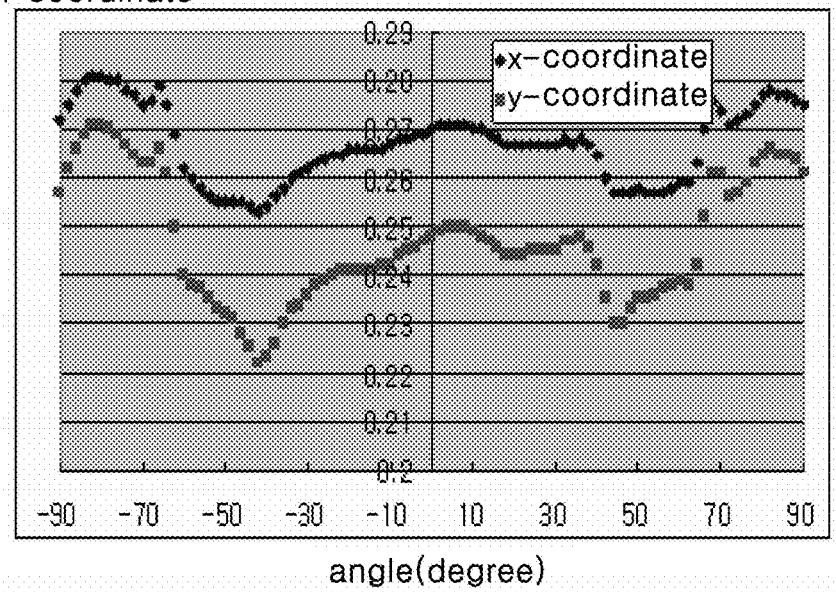
FIG. 10 is a graph depicting chromatic aberration of the aspherical LED lens of FIG. 8.

Next, referring to FIG. 10, chromatic aberration of the aspherical LED lens 360 of FIG. 8 is illustrated. Specifically, in the orientation angle curve of the aspherical LED lens 360, X-coordinate variation (ΔX) is about 0.028 and Y-coordinate variation (ΔY) is 0.049 at an orientation angle within ±90 degrees. Accordingly, the aspherical LED lens 360 has reduced chromatic aberration through significant reduction of the X-coordinate variation (ΔX) and the Y-coordinate variation (ΔY), as compared with the chromatic aberration graph (ΔX=about 0.047, ΔY=0.082) of FIG. 7.

Consequently, when the aspherical lens 360 including the side protrusions 363 is employed as a light source for a backlight unit of a display device, for example, the display device has uniform illumination and brightness on the panel of the display device while eliminating spots such as yellow spots or yellow rings caused by the chromatic aberration. In addition, as the chromatic aberration is reduced by the formation of the side protrusions 363 without using the dispersing agent, the display device does not suffer deterioration in brightness caused by a reduction in the amount of light passing through the lens.

In fabrication of the aspherical LED lens 360 according to the present exemplary embodiment, a light-transmitting material such as silicone, epoxy, glass or plastic may be used. For example, liquid silicone rubber (LSR) has sufficiently low viscosity to provide good flexibility and suffers less decrease in viscosity at high temperature than currently used adhesive silicone resins, thereby providing improved workability. In addition, the LSR permits automatic production by injection molding due to low viscosity thereof and provides excellent productivity. Furthermore, since the LSR does not exhibit release properties with respect to a mold, the LSR may not cause a lens interface phenomenon and permits easy formation of the protrusions (roughness) on the lens when forming the protrusions by sand blasting on the surface of the mold.

According to an exemplary embodiment, the dispersing agent is mixed with a silicone resin used in fabrication of the aspherical LED lens 360 to achieve a further reduction of chromatic aberration. For example, an aspherical LED lens may be produced by injection molding of a mixture prepared by mixing the LSR with a $SiO_2$ dispersing agent. In this case, since the dispersing agent may reduce the amount of light in proportion to reduction in the degree of chromatic aberration or provide a different orientation angle curve from that shown in FIG. 9, the mixing ratio of the dispersing agent in the LSR may be adjusted accordingly.

Experiments showed that the aspherical LED lens exhibited desired brightness with less chromatic aberration when the dispersing agent is mixed in an amount of about 0.3~0.4% with respect to the total amount of the LSR. The present invention is not limited to a specific kind or mixing ratio of dispersing agent.

Figure 11:
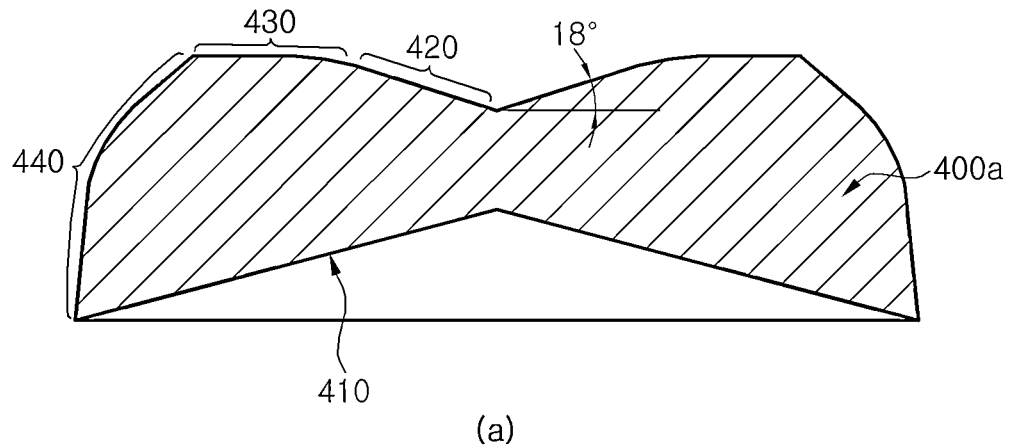
FIGS. 11(a), 11(b) and 11(c) are side sectional views of aspherical LED lenses including linear sections according to exemplary embodiments of the present invention.
Figure 11:
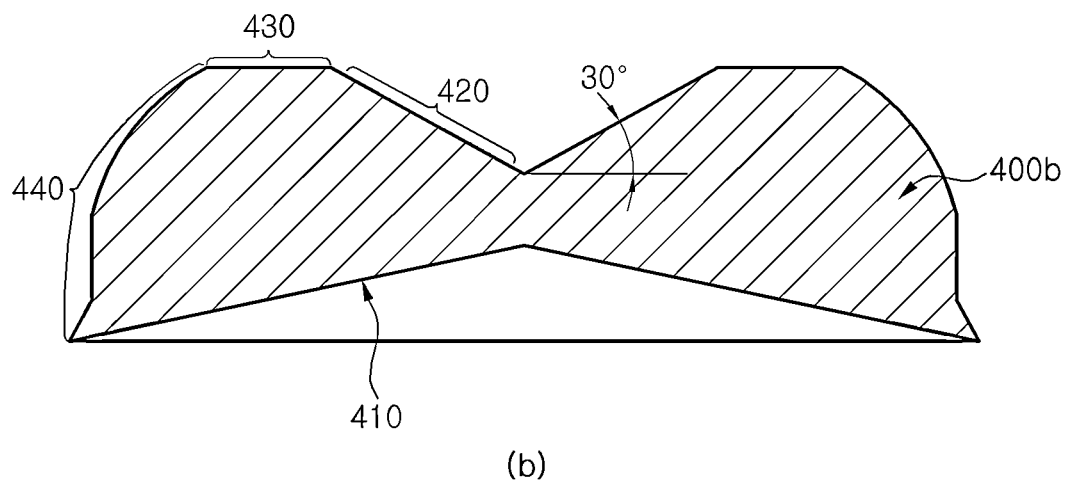
Figure 11:
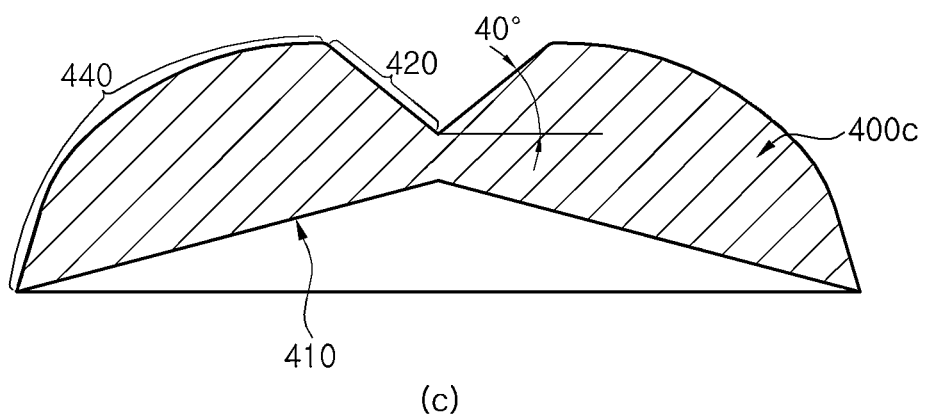

FIGS. 11(a), 11(b) and 11(c) are side sectional views of aspherical LED lenses including linear sections according to exemplary embodiments of the present invention, respectively. A repeated description of elements described above will be omitted herein for clarity.

Referring to FIG. 11(a), a light exit plane may include linear sections. Specifically, the light exit plane of an aspherical LED lens 400a includes linear sections 420 near a concavely depressed portion, a side section 440 including a curved surface, and a linear section 430 disposed between the linear section and the side section. In an alternative embodiment, as shown in FIG. 11(c), a light exit plane of an aspherical lens 400c may include linear sections 420 only near the depressed portion without the linear section 430. Namely, each of the light exit planes of the aspherical LED lenses according to these embodiments may include at least two linear sections 420 that meet at the central axis (y) of the lens.

Further, the aspherical LED lens 400a of FIG. 11(a) has the linear sections 420 slanted at about 18 degrees with respect to the horizontal, an aspherical LED lens 400b of FIG. 11(b) has linear sections 420 slanted at about 30 degrees with respect to the horizontal, and the aspherical lens 400c of FIG. 11(c) has linear sections 420 slanted at about 40 degrees with respect to the horizontal.

For the respective aspherical lenses of FIGS. 11(a) to 11(c), the degree of chromatic aberration and generation of yellow spots on the panel are listed in the following Table 1.

TABLE 1

|  | Chromatic aberration (orientation angle ±90°) | Yellow spot on panel |
| --- | --- | --- |
| Lens 400a | $\Delta x = 0.021/\Delta y = 0.069$ | No occurrence |
| Lens 400b | $\Delta x = 0.016/\Delta y = 0.038$ | No occurrence |
| Lens 400c | $\Delta x = 0.032/\Delta y = 0.072$ | Occurrence |

For the degree of chromatic aberration, the X-coordinate variation ($\Delta X$) and the Y-coordinate variation at an orientation angle within ±90 degrees are $\Delta x=0.021/\Delta y=0.069$ for the lens 400a, $\Delta x=0.016/\Delta y=0.038$ for the lens 400b, and $\Delta x=0.032/\Delta y=0.072$ for the lens 400c. The lens 400c generates yellows spots on the panel due to the chromatic aberration, unlike the lenses 400a, 400b.

Consequently, for the light exit plane of the aspherical lens 400 including at least two linear sections 420 that meet each other at the central axis, chromatic aberration is pronounced when each of the linear sections is slanted at an angle of about 35~40 degrees or more with respect to the horizontal direction.

Accordingly, when producing the aspherical lens including the linear sections according to the present exemplary embodiment, the inclination of the linear sections may be adjusted to about 10~40 degrees with respect to the horizontal direction by taking into consideration that severe chromatic aberration may occur depending on the inclination of the linear sections near the depressed portion of the aspherical lens at an angle greater than about 35-40 degrees.

Meanwhile, although roughness or protrusions are not shown on a side surface 440 of each of the aspherical lenses in FIGS. 11(a), 11(b) and 11(c) for clarity of illustration, each of the light exit planes may further include the roughness or protrusion on the side surface thereof to reduce chromatic aberration.

Figure 12:
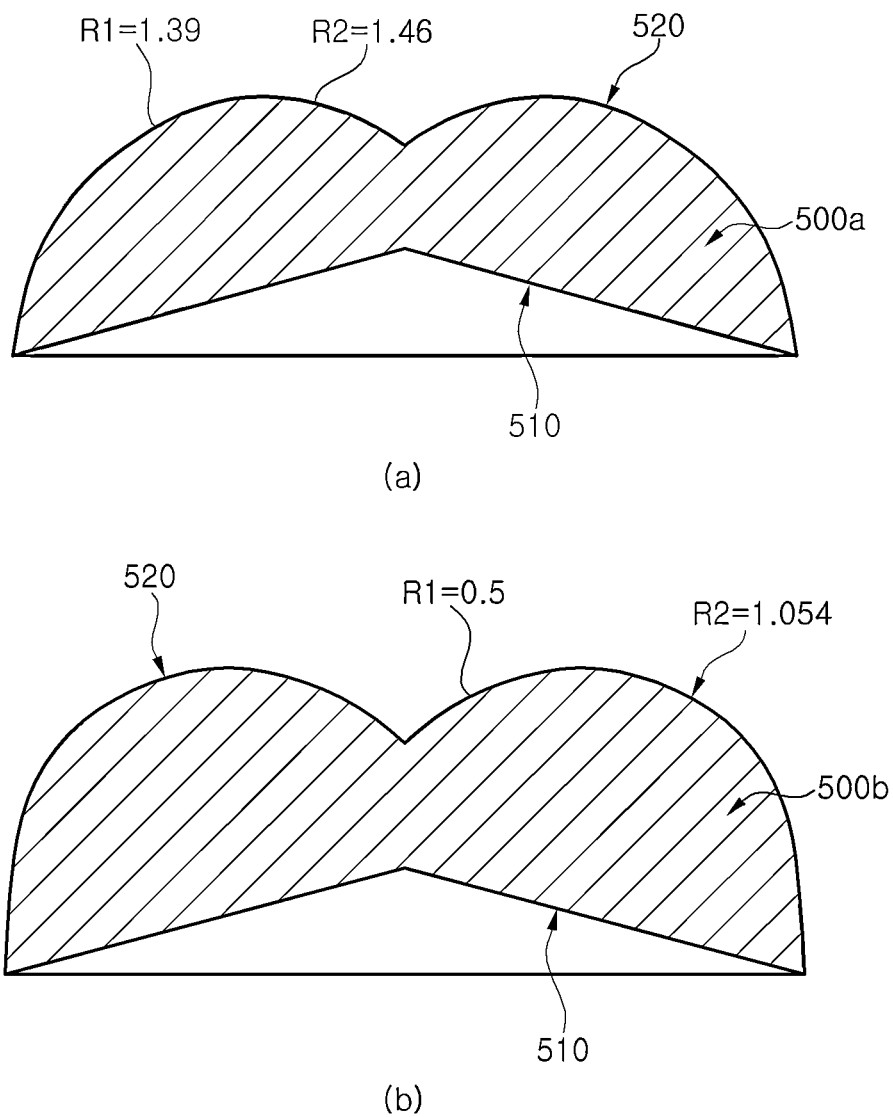
FIGS. 12(a) and 12(b) are side sectional views of aspherical LED lenses, each of which has a light exit plane composed of curved sections having different radii of curvature, according to exemplary embodiments of the present invention.

FIGS. 12(a) and 12(b) are side sectional views of aspherical LED lenses, each of which has a light exit plane composed of curved sections having different radii of curvature, according to exemplary embodiments. A repeated description of elements described above will be omitted herein for clarity.

Referring to FIGS. 12(a) and 12(b), a light exit plane 520 of an aspherical LED lens 500 is not composed of a single curved section having a single radius of curvature. Instead, the light exit plane 520 may be composed of plural curved sections having different radii of curvature. Namely, the light exit plane 520 may be composed of a combination of the curved sections having different radii of curvature. Specifically, in FIG. 12(a), the light exit plane 520 is composed of curved sections having a radius of curvature of R1=1.39 and a radius of curvature of R2=1.46, respectively, and in FIG. 12(b), the light exit plane 520 is composed of curved sections having a radius of curvature of R1=0.5 and a radius of curvature of R2=1.054, respectively.

In other words, the light exit plane 520 of FIG. 12(a) is generally composed of the curved sections having relatively large radii of curvature (that is, small curvatures), and the light exit plane 520 of FIG. 12(b) is generally composed of the curved sections having relatively small radii of curvature (that is, large curvatures). For the respective aspherical lenses of FIGS. 12(a) and 12(b), the degree of chromatic aberration and generation of yellow spots on the panel are listed in the following Table 2.

TABLE 2

|  | Chromatic aberration (orientation angle ±90°) | Yellow spot on panel |
| --- | --- | --- |
| Lens 500a | $\Delta x = 0.04/\Delta y = 0.072$ | No occurrence |
| Lens 500b | $\Delta x = 0.072/\Delta y = 0.109$ | Occurrence |

For the degree of chromatic aberration, the X-coordinate variation ($\Delta X$) and the Y-coordinate variation ($\Delta Y$) at an orientation angle within ±90 degrees are $\Delta x=0.04/\Delta y=0.072$ for the lens 500a having the light exit plane 520 generally composed of the curved sections having large radii of curvature, and are $\Delta x=0.072/\Delta y=0.109$ for the lens 500b having the light exit plane 520 generally composed of the curved sections having small radii of curvature. The lens 500b generates yellow spots or yellow rings on the panel due to the chromatic aberration, unlike the lens 500a.

Consequently, in the formation of the aspherical lens 500, chromatic aberration is severe at some regions of the light exit plane having small radii of curvature.

Accordingly, when producing the aspherical lens including the plural curved sections having different radii of curvature, it is desirable to adjust the radii of curvature of the curved sections to about 1.0~5.0 by taking into consideration that severe chromatic aberration can occur at regions of the light exit plane having a radii of curvature less than about 1.3.

Meanwhile, although roughness or protrusions are not shown on a side surface of the light exit plane in FIGS. 12(a) and 12(b) for clarity of illustration, each of the aspherical lenses may further include the roughness or protrusion on the side surface of the light exit plane to reduce chromatic aberration.

Figure 13:
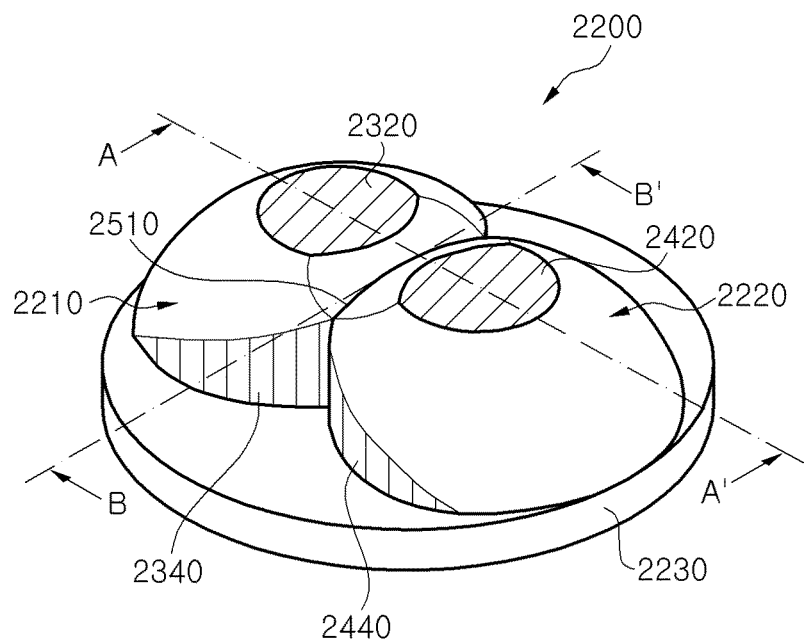
FIG. 13 is a perspective view of an aspherical LED lens according to an exemplary embodiment of the present invention.

Next, an aspherical LED lens 2200 according to an exemplary embodiment of the present invention will be described with reference to FIGS. 13 and 14. FIG. 13 is a perspective view of an aspherical LED lens according to the exemplary embodiment and FIG. 14 is a top view of the aspherical LED lens of FIG. 13.

Referring to FIG. 13, the aspherical LED lens 2200 of the present exemplary embodiment includes a first lens section 2210, a second lens section 2220, and a supporting is section 2230. The first and second lens sections 2210, 2220 (also referred to as a "lens part") are symmetrical with respect to the central axis Y. The lens sections have substantially semi-spherical shapes and are in surface contact with each other such that the overall shape of the aspherical LED lens 2200 except for the supporting section 2230 is similar to a peanut shape when view from above, as shown in FIG. 14.

Figure 14:
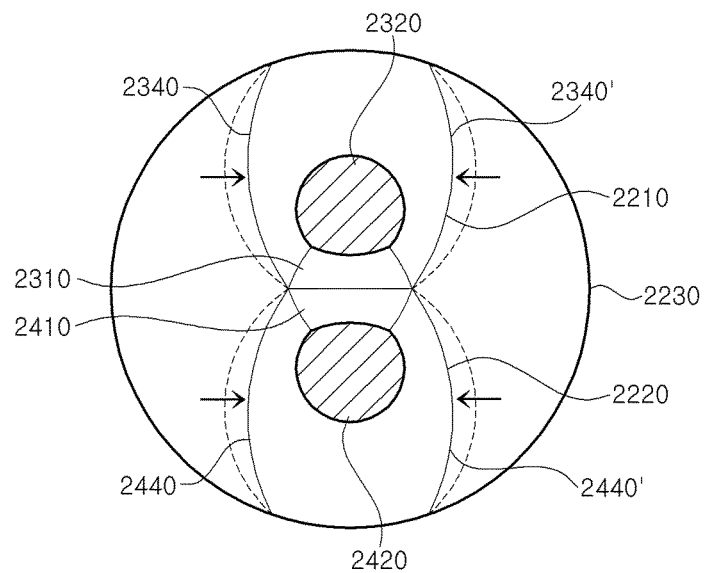
FIG. 14 is a top view of the aspherical LED lens of FIG. 13.

Specifically, referring to FIG. 14, the lens part of the aspherical LED lens 2200 according to the present exemplary embodiment has a shape in which two semispherical convex lenses indicated by a dotted line are in surface contact with each other, with side surfaces 2340, 2340', 2440, 2440' of the lens shifted inwards from the circular dotted line in a direction indicated by arrows. In this manner, as the first and second lens sections 2210, 2220 are in surface contact with each other to form an elongated lens part having a peanut shape, the orientation angle curve of the aspherical LED lens 2200 is different from that of the conventional LED lens 4 shown in FIG. 1. Further, it is possible to adjust a lateral width of an area illuminated by the light emitting device by adjusting a distance by which the side surfaces 2340, 2340', 2440, 2440' of the lens are shifted. In other words, as the side surfaces 2340, 2340', 2440, 2440' of the lens are shifted inwards to reduce the thickness of the aspherical LED lens 2200, the width of the illuminated area may be narrowed.

The supporting section 2230 is not limited to a specific structure. For example, the supporting section 2230 may be integrally formed with the first and second lens sections 2210, 2220. Alternatively, the supporting section 2230 may be separately prepared and attached to the first and second lens sections 2210, 2220. The supporting section 2230 covers the substrate 2240 having an LED chip 2120 (see FIG. 15) mounted thereon so as to cover not only the LED chip 2120, but also a bonding wire (not shown) electrically connected to an electrode formed on the LED chip 2120 and a patterned electrode (not shown) formed on the substrate 2240 to supply power to the LED chip 2120, so that these elements may be prevented from being exposed to air and can be protected from external impact or moisture.

Details of the lens part of the aspherical LED lens 2200 according to the present exemplary embodiment will be described in more detail with reference to FIGS. 15 and 16, which illustrate an LED package, that is, a light emitting device, including the aspherical LED lens 2200.

Figure 15:
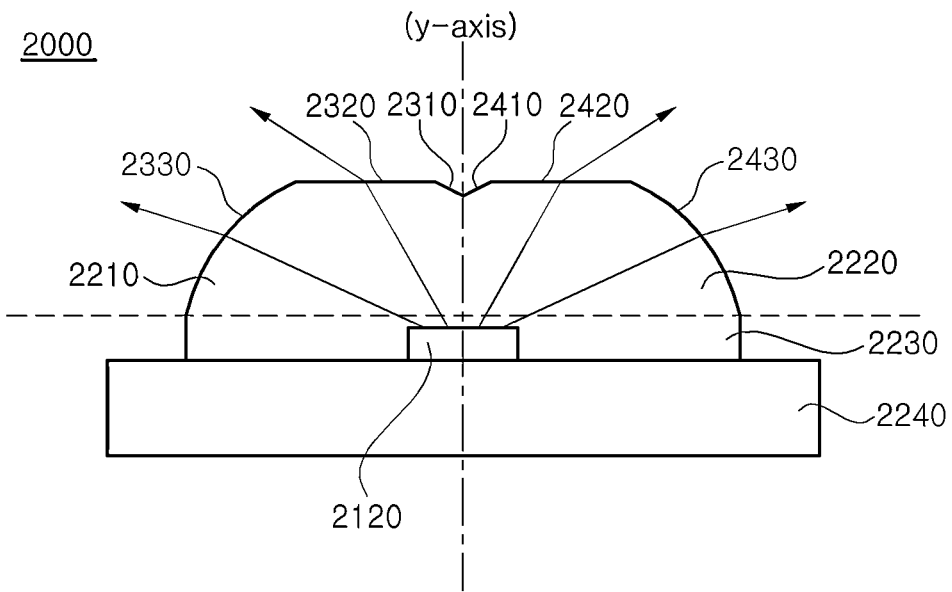
FIG. 15 is a cross-sectional view of the aspherical LED lens of FIG. 13 taken along a major axis of the lens.

FIG. 15 is a cross-sectional view of a light emitting device 2000 including the aspherical LED lens 2200 of FIG. 13 taken along a major axis of the lens, that is, along line A-A' of FIG. 13. FIG. 16 is a cross-sectional view of the light emitting device 2000 including the aspherical LED lens 2200 of FIG. 13 taken along a minor axis of the lens, that is, along line B-B of FIG. 13. It should be noted that FIGS. 15 and 16 illustrate characteristic features of the invention without illustration of elements, such as a lead frame, an electric circuit, an electric wire, and the like, which are used for operation or other functions of the light emitting device 2000 but are not directly related to the scope of the invention, for clarity of illustration.

Figure 16:
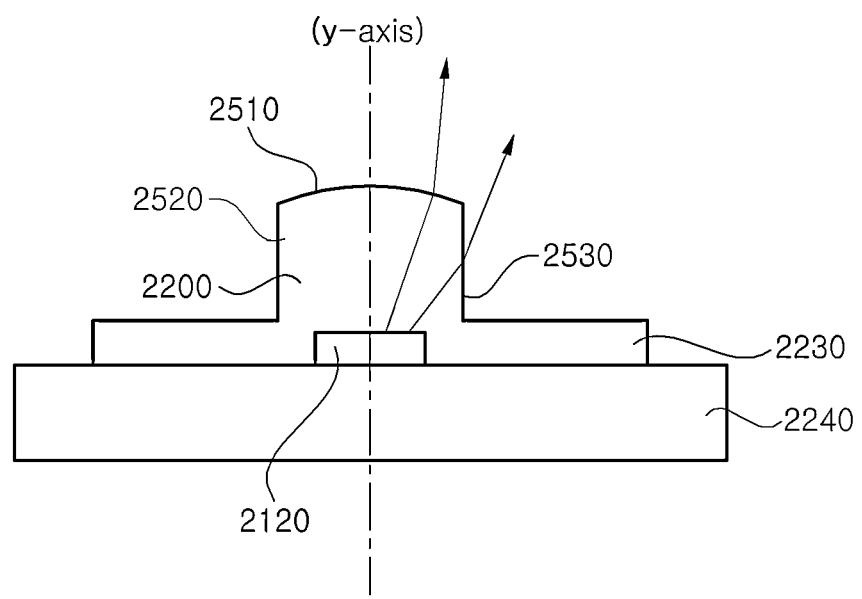
FIG. 16 is a cross-sectional view of the aspherical LED lens of FIG. 13 taken along a minor axis of the lens.

As shown in FIGS. 15 and 16, the light emitting device 2000 according to the present exemplary embodiment may include a substrate 2240, an LED chip 2120 mounted on the substrate 2240, and an aspherical LED lens 2200.

Any substrate may be used as the substrate so long as the substrate allows a high density of LED chips 2120 to be mounted thereon. Examples of such a substrate include, but are not limited to, alumina, quartz, calcium zirconate, forsterite, SiC, graphite, fused silica, mullite, cordierite, zirconia, beryllia, aluminum nitride, and low temperature co-fired ceramic (LTCC). The ceramic material may be applied to a multi-layer ceramic package (MLP), which includes a pattern of metallic conductor wires formed thereon and subjected to sintering. The ceramic material used for such a semiconductor package provides excellent air-tightness.

Further, although not shown in the drawings, the substrate 2240 has patterned electrodes, which are formed of a highly conductive metal such as copper or aluminum and may be separately formed corresponding to an anode and a cathode of the LED chip 2120.

The LED chip 2120 may be, for example, a blue LED chip that emits blue light in a wavelength band of 430~480 nm or a UV LED that emits UV light in a wavelength band of 350~410 nm. Alternatively, the LED chip 2120 may be configured to emit other colors. As such, the present invention is not limited to a specific LED chip.

The LED chip 2120 is mounted on an upper surface of the substrate 2240 and may be placed at a location where the central axis of the aspherical LED lens 2200 meets the substrate 2240. Specifically, the LED chip 2120 may be disposed at the center of the aspherical LED lens 2200, which may be bonded or joined to the upper surface of the substrate 2240 including the LED chip 2120 by an adhesive or other means. Although the aspherical LED lens 2200 is illustrated as including a single LED chip in FIGS. 15 and 16, the aspherical LED lens may include a plurality of LED chips.

Further, although not shown in the drawings, a fluorescent material may be directly deposited on the LED chip 2120 to generate a certain color using light emitted from the LED chip 2120 as an excitation source. For example, if the LED chip 2120 is a blue LED chip composed of semiconductors for emitting light in a wavelength band of 430~480 nm, phosphors emitting yellow-green or yellow light using some of the light as an excitation source are deposited on the LED chip 2120, so that the light emitting device can emit white light by a combination of blue light emitted from the LED chip 2120 and yellow-green or yellow light emitted from the phosphors. Further, the fluorescent material may be directly deposited on the LED chip 2120 or may be contained in a resin for forming the aspherical LED lens 2200. Alternatively, the fluorescent material may be provided as a separate phosphor sheet.

The aspherical LED lens 2200 serves to adjust an orientation angle of light by changing a travel direction of light emitted from the LED chip 2120 and may be formed of a light-transmitting material such as silicone, epoxy, glass or plastic.

According to the present exemplary embodiment, the aspherical LED lens 2200 includes a first lens section 2210 and a second lens section 2220 positioned symmetrically about the central axis Y and a supporting section 2230 formed under the first and second lens sections 2210, 2220. In other words, the first and second lens sections 2210, 2220 are in surface contact with each other to form a convexly protruded shape at a central region 2510 of the lens, as shown in FIG. 16.

Referring again to FIG. 15, on the cross-section of the aspherical LED lens 2200 taken along the major axis of the LED lens, the first and second lens sections 2210, 2220 are bilaterally symmetrical. Specifically, the first lens section 2210 includes a first slanted portion 2310, a first flat portion 2320 and a first convex portion 2330, and the second lens section 2220 includes a second slanted portion 2410, a second flat portion 2420 and a second convex portion 2430. Thus, the first slanted portion 2310, the first flat portion 2320 and the first convex portion 2330 may be symmetrical to and have the same length as the second slanted portion 2410, the second flat portion 2420, and the second convex portion 2430, respectively.

Specifically, the first flat portion 2320 and the second flat portion 2420 are the uppermost flat regions of the first lens section 2210 and the second lens section 2220 (see FIG. 14) to form linear structures, respectively. Each of the first slanted portion 2310 and the second slanted portion 2410 is connected to one end of each of the first flat portion 2320 and the second flat portion 2420, and may be a curved surface slanted towards the central axis Y. Thus, the first slanted portion 2310 and the second slanted portion 2410 are coupled to each other at the central axis Y to form a concave cross-section at the center of the aspherical LED lens 2200. Further, each of the first convex portion 2330 and the second convex portion 2430 is connected to the other end of each of the first flat portion 2320 and the second flat portion 2420, and is a curved surface bulging towards an outside of the aspherical LED lens 2200. Here, the first slanted portion 2310 (or the second slanted portion 2410) may have the same or different curvature from the first convex portion 2330 (or the second convex portion 2430).

Figure 17:
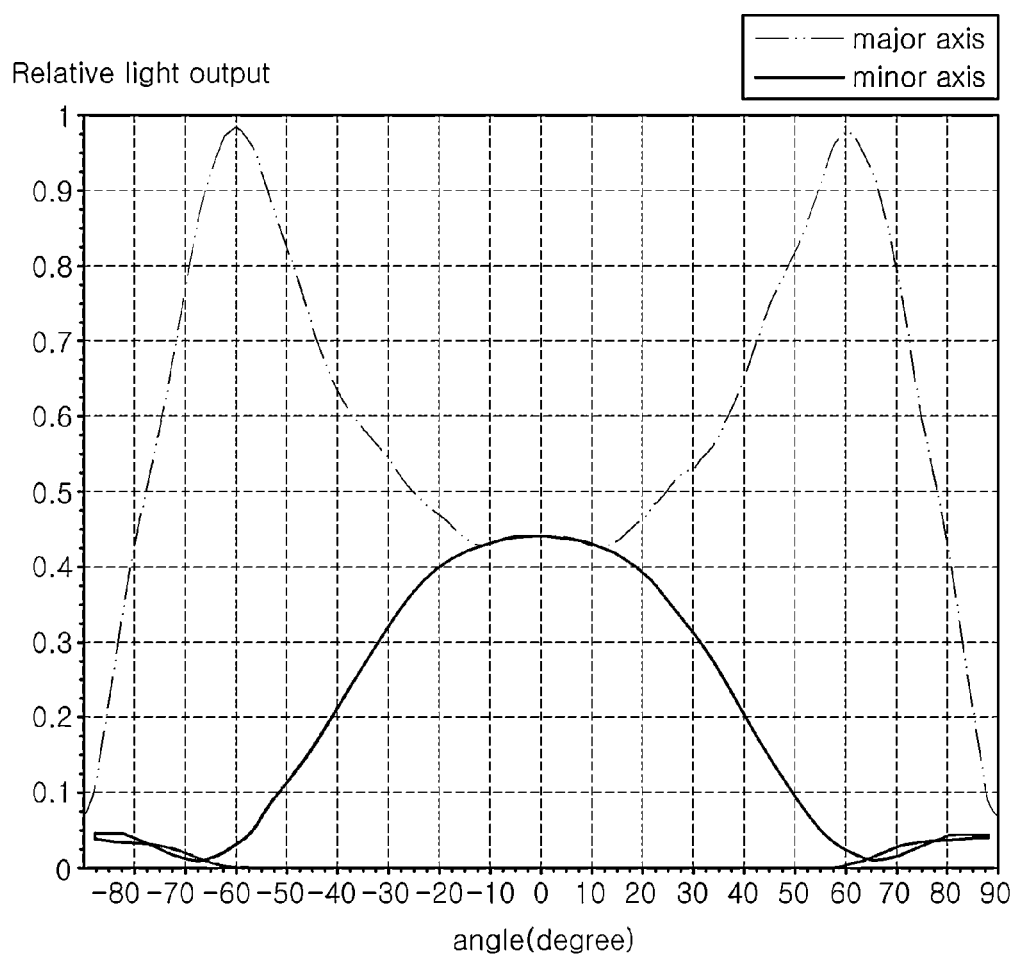
FIG. 17 is a graph depicting an orientation angle curve of a light emitting device employing the aspherical LED lens of FIG. 13.

When emitted from the LED chip 2120 to the outside, light is refracted away from the central axis Y by a difference in refractive index between air and the resin for forming the aspherical LED lens 2200 and angles of slanted outer surfaces of the first and second lens sections 2210, 2220. FIG. 15 schematically illustrates an optical path of light emitted from the LED chip 2120 using an arrow. Further, a light orientation angle curve of the aspherical LED lens 2200 is shown in FIG. 17. The light orientation angle curve of the aspherical LED lens 2200 will be described below.

Referring to FIG. 16, the cross-section of the aspherical LED lens 2200 taken along line B-B of FIG. 13 is shown.

The minor axis cross-section of the aspherical LED lens 2200 may include a central lens region 2510, first and second planes 2520, 2530 respectively connected to both ends of the central lens region 2510, and a supporting section 2230. As can be seen from FIG. 16, the minor axis cross-section of the aspherical LED lens 2200 substantially has a " 凸 " shape with the central lens region 2510 convexly protruded, and is different from the major axis cross-is section of the aspherical LED lens 2200 shown in FIG. 15.

As in FIG. 15, FIG. 16 schematically illustrates an optical path of light emitted from the LED chip 2120 using an arrow. Unlike the optical path of FIG. 15, when emitted from the LED chip 2120, light is refracted towards the central axis of the LED lens 2200 on the first and second planes 2520, 2530 of the aspherical LED lens 2200 such that several light beams can be directed upwards outside the aspherical LED lens 2200.

Next, referring to FIG. 17, the light orientation angle curve of the light emitting device 2000, as a product of the aspherical LED lens 2200 according to the present exemplary embodiment, will be described. In FIG. 17, a dashed line indicates a light orientation angle curve on the major axis cross-section of the lens and a solid line indicates a light orientation angle curve on the minor axis cross-section of the lens.

Referring to FIG. 17, when using the aspherical LED lens 2200, the light orientation angle curve on the major axis cross-section of the LED lens 2200 generally has an M-shaped curve due to a relative decrease in optical intensity at the center of the lens 2200 and a significant increase in optical intensity at both sides of the lens 2200. On the contrary, in the light orientation angle curve on the minor axis cross-section of the LED lens 2200, optical intensity relatively increases at the center of the aspherical LED lens 2200 and gradually deceases towards both sides of the aspherical LED lens 2200, since the light is focused on the center of the lens.

In other words, the light orientation angle curve on the major axis cross-section of the aspherical LED lens 2200 is different from the light orientation angle curve on the minor axis cross-section of the aspherical LED lens 2200, thereby forming asymmetrical light orientation angle curves.

Particularly, in the orientation angle curve on the major axis cross-section of the LED lens 2200 shown in FIG. 13, peak angles at both sides of the lens are about 50~70 degrees and the intensity of light at the center of the lens is about 40~50% of the peak value. On the contrary, in the orientation angle curve on the minor axis cross-section of the LED lens 2200, the orientation angle is about 70~90 degrees.

Thus, when the light emitting device 2000 employs the aspherical LED lens 2200, light is broadly emitted from right and lefts sides of the light emitting device 2000 with reference to a major axis plane of the aspherical LED lens 2200. Accordingly, when such light emitting devices 2000 are used for a street lamp, for example, it is possible to form an elongated illumination area along a roadside using light emitted from the light emitting devices 2000. Further, since light is focused on the center of the lens with reference to a minor axis plane of the aspherical LED lens 2200, a road area within a certain radius of the street lamp can be illuminated with higher brightness than other areas. In other words, the light emitting device 2000 including the aspherical LED lens 2200 emits light in different patterns along the major axis and the minor axis of the aspherical LED lens, thereby making it possible to achieve efficient illumination of a road according to a road condition when applied to the street lamp.

Figure 18:
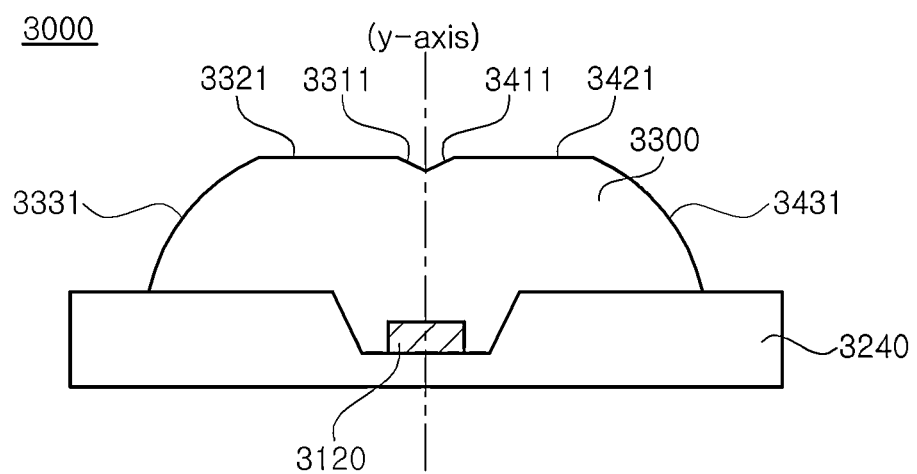
FIG. 18 is a cross-sectional view taken along a major axis of an aspherical LED lens according to an exemplary embodiment of the present invention.
Figure 19:
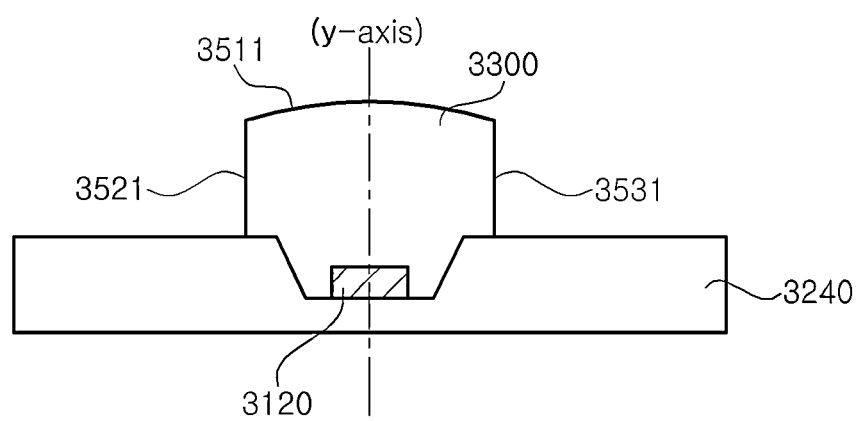
FIG. 19 is a cross-sectional view of the aspherical LED lens of FIG. 18 taken is along a minor axis of the aspherical LED lens.

FIGS. 18 and 19 illustrate a light emitting device 3000 including an aspherical LED lens 3200 according to an exemplary embodiment of the present invention. Specifically, FIG. 18 is a cross-sectional view of the light emitting device 3000 taken along a major axis of the aspherical LED lens 3200 and FIG. 19 is a cross-sectional view of the light emitting device 3000 taken along a minor axis of the aspherical LED lens 3200. It should be noted that FIGS. 18 and 19 illustrate characteristic features of the invention without illustration of elements, such as a lead frame, an electric circuit, an electric wire, and the like, which are used for operation or other functions of the light emitting device 3000 but are not directly related to the scope of the invention, for clarity of illustration. A repeated description of elements described in FIGS. 15 and 16 will be omitted herein.

As shown in FIGS. 18 and 19, the light emitting device 3000 according to the present exemplary embodiment may include a substrate 3240, an LED chip 3120 mounted on the substrate 3240, and the aspherical LED lens 3200.

Unlike the light emitting device 2000 shown in FIGS. 15 and 16, the substrate 3240 may include a cavity depressed to a predetermined depth. Accordingly, as described below, although the aspherical LED lens 3200 does not include the supporting section, the LED chip 3120 can be protected by the aspherical LED lens 3200, since the LED chip 3120 is mounted in the cavity.

The LED chip 3120 may be, for example, a blue light emitting diode chip that emits blue light in a wavelength band of 430~480 nm or a UV light emitting diode chip that emits UV light in a wavelength band of 350~410 nm. Alternatively, the LED chip 3120 may be configured to emit other colors of light. As such, the present invention is not limited to a specific LED chip.

The LED chip 3120 is mounted in the cavity on the substrate 3240 and may be placed at a location where a central axis of the aspherical LED lens 3200 meets the substrate 3240. Specifically, the LED chip 3120 may be disposed at the center of the aspherical LED lens 3200, which may be bonded or joined to the upper surface of the substrate 3240 including the LED chip 3120 by an adhesive or other means. Although the aspherical LED lens 3200 is illustrated as including a single LED chip 3120 in FIGS. 18 and 19, it should be understood that the aspherical LED lens may include a plurality of LED chips.

Further, although not shown in the drawings, a fluorescent material may be directly deposited on the LED chip 3120 to generate a certain color using light emitted from the LED chip 3120 as an excitation source. Here, the fluorescent material may be contained in a resin for forming the aspherical LED lens 3200. Alternatively, the fluorescent material may be provided as a separate phosphor sheet.

The aspherical LED lens 3200 serves to adjust an orientation angle of light by changing a travel direction of light emitted from the LED chip 3120 and may be formed of a light-transmitting material such as silicone, epoxy, glass or plastic.

According to the present exemplary embodiment, the aspherical LED lens 3200 includes a first lens section 3211 and a second lens section 3221 positioned symmetrically about the central axis Y, without the supporting section as described above. The first and second lens sections 3211, 3221 are in surface contact with each other to form a convexly protruded shape at a central region 3511 of the lens, as shown in FIG. 19.

Referring again to FIG. 18, on a major axis cross-section of the aspherical LED lens 3200, the first and second lens sections 3211, 3221 are bilaterally symmetrical. Specifically, the first lens section 3211 includes a first slanted portion 3311, a first flat portion 3321 and a first convex portion 3331, and the second lens section 3211 includes a second slanted portion 3411, a second flat portion 3421 and a second convex portion 3431. Thus, the first slanted portion 3311, the first flat portion 3321 and the first convex portion 3331 may be symmetrical to the second slanted portion 3411, the second flat portion 3421, and the second convex portion 3431, respectively. In particular, since the first slanted portion 3311 and the first convex portion 3331 are symmetrical to the second slanted portion 3411 and the second convex portion 3431, respectively, the first slanted portion 3311 and the first convex portion 3331 may have the same lengths and radii of curvature as those of the second slanted portion 3411 and the second convex portion 3431, respectively.

Specifically, the first flat portion 3321 and the second flat portion 3421 are the uppermost flat regions of the first lens section 3211 and the second lens section 3221 to form linear structures, respectively. Each of the first slanted portion 3311 and the second slanted portion 3411 is connected to one end of each of the first flat portion 3321 and the second flat portion 3421, and may be a curved surface slanted towards the central axis Y. Thus, the first slanted portion 3311 and the second slanted portion 3411 are coupled to each other at the central axis Y to form a concave cross-section at the center of the aspherical LED lens 3200. Further, each of the first convex portion 3331 and the second convex portion 3431 is connected to the other end of each of the first flat portion 3321 and the second flat portion 3421, and is a curved surface bulging towards an outside of the aspherical LED lens 3200. Here, the first slanted portion 3311 (or the second slanted portion 3411) may have the same or different curvature from the first convex portion 3330 (or the second convex portion 3430).

When emitted from the LED chip 3120 to the outside, light is refracted away from the central axis Y by a difference in refractive index between air and the resin for forming the aspherical LED lens 3200 and angles of slanted outer surfaces of the first and second lens sections 3210, 3220.

Referring now to FIG. 19, the minor axis cross-section of the aspherical LED lens 3200 may include a central lens region 3511 and first and second planes 3521, 3531 respectively connected to both ends of the central lens region 2510, and need not include the supporting section. When emitted from the LED chip 3120, light is refracted towards the central axis of the lens on the first and second planes 3521, 3531 of the aspherical LED lens 3200 such that several light beams can be directed upwards outside the aspherical LED lens 3200.

Therefore, the orientation angle curve of the aspherical LED lens 3200 has the shape of FIG. 17, which is similar to the shape of the orientation angle curve of the aspherical LED lens described above. Specifically, when using the aspherical LED lens 3200, the light orientation angle curve on the major axis cross-section of the aspherical LED lens 3200 generally has an M-shaped curve due to a relative decrease in optical intensity at the center of the aspherical LED lens 3200 and a significant increase in optical intensity at both sides of the aspherical LED lens 3200. On the contrary, in the light orientation angle curve on the minor axis cross-section of the aspherical LED lens 3200, the optical intensity relatively increases at the center of the aspherical LED lens 3200 and gradually deceases towards both sides of the aspherical LED lens 3200, since the light is focused on the center of the lens. As such, the light orientation angle curve on the major axis cross-section of the aspherical LED lens 3200 is different from the light orientation angle curve on the minor axis cross-section of the aspherical LED lens 3200, thereby forming asymmetrical light orientation angle curves.

Particularly, in the orientation angle curve on the major axis cross-section of the LED lens 3200, peak angles at both sides of the lens are about 50~70 degrees and the intensity of light at the center of the lens is about 40~50% of the peak value. On the contrary, in the orientation angle curve on the minor axis cross-section of the LED lens 3200, the orientation angle is about 70~90 degrees.

Thus, when the light emitting device 3000 employing the aspherical LED lens 3200 is used for a street light, for example, it is possible to form an elongated illumination area along a roadside using light emitted from the light emitting devices 3000. Further, since light is focused on the center of the lens with reference to a minor axis plane of the aspherical LED lens 3200, a road area within a certain radius of the street lamp can be illuminated with higher brightness than other areas.

The aspherical LED lens according to exemplary embodiments of the present invention may be used to provide a double-peak orientation angle curve of light. Accordingly, a display device employing the aspherical LED lens as a light source for a backlight unit can provide uniform illumination to a panel of the display device while significantly reducing chromatic aberration.

In addition, when a light emitting device employing the aspherical LED lens is used for a display device, the display device has uniform illumination or brightness on the panel of the display device and eliminates spots caused by chromatic aberration, thereby improving display quality.

According to other exemplary embodiments of the present invention, the orientation angle curve on the major axis of the aspherical LED lens has peak angles at locations deviated from the center of the LED lens and the orientation angle curve on the minor axis of the aspherical LED lens has a peak angle at the center of the LED lens, so that the aspherical LED lens provides different light orientation angle curves in the directions of the major axis and the minor axis of the LED lens.

Accordingly, when light emitting devices employing such an aspherical LED lens are used for street lights, the light emitting devices may provide an illumination region longitudinally formed along a roadside.

Although the invention has been illustrated with reference to some exemplary embodiments in conjunction with the drawings, it will be apparent to those skilled in the art that various modifications and changes can be made to the invention without departing from the spirit and scope of the invention. Therefore, it should be understood that the embodiments are is provided by way of illustration only and are given to provide complete disclosure of the invention and to provide thorough understanding of the invention to those skilled in the art. Thus, it is intended that the invention covers the modifications and variations of this invention provided they come within the scope of the appended claims and their equivalents.

What is claimed is:

1. An aspherical lens, comprising:
a light entrance plane configured to receive light emitted from a light source; and
a light exit plane configured to radiate the light received by the light entrance plane,
wherein the light exit plane comprises:
protrusions disposed on a portion of a side surface of the light exit plane; and
a curved surface disposed on the side surface of the light exit plane,
wherein the aspherical lens has a symmetrical structure.

2. The aspherical lens of claim 1, wherein the light entrance plane comprises conical section centered on the central axis of the aspherical lens.

3. The aspherical lens of claim 1, wherein the curved surface comprises radii of curvature ranging from 1.0 to 5.0.

4. The aspherical lens of claim 1, wherein the aspherical lens comprises a dispersing part.

5. A light emitting device, comprising:
a substrate;
a light emitting diode (LED) chip disposed on the substrate; and
an aspherical LED lens disposed on the LED chip, the aspherical LED lens comprising a radially symmetrical structure with respect to a central axis of the aspherical LED lens,
wherein the aspherical LED lens comprises:
protrusions disposed on a portion of a side surface of the light exit plane;
a curved surface disposed on the side surface of the light exit plane; and
a linear section disposed between the curved surface and a central axis of the aspherical LED lens.

6. The light emitting device of claim 5, wherein the LED chip is surrounded by fluorescent material.

7. The light emitting device of claim 5, wherein the light emitting device comprises an encapsulation material surrounding the LED chip.

8. The light emitting device of claim 5, wherein the light entrance plane comprises conical section centered on the central axis of the aspherical lens.

9. The light emitting device of claim 5, wherein the light emitting device comprises an air layer between the light entrance plane and the LED chip.

10. The aspherical lens of claim 5, wherein the curved surface comprises radii of curvature ranging from 1.0 to 5.0.

11. The light emitting device of claim 5, wherein the aspherical LED lens comprises a dispersing part.

12. The light emitting device of claim 5, wherein the LED chip is disposed on the central axis of the aspherical LED lens.

13. The light emitting device of claim 5, wherein the substrate comprises a cavity in which the LED chip is disposed.

14. A light emitting device, comprising;
a substrate;
a light emitting diode (LED) chip disposed on the substrate,
fluorescent material disposed on the LED chip;
an aspherical LED lens disposed on the LED chip, the aspherical LED lens comprising:
different cross-sections respectively taken along a major axis and a minor axis of the aspherical LED lens; and
protrusions disposed on a side surface of the aspherical LED lens.

15. The aspherical lens of claim 1, wherein the aspherical lens comprises a linear section disposed between the curved surface and a central axis of the aspherical lens.

* * * * *